(12) United States Patent
Nakagawa

(10) Patent No.: US 9,973,082 B1
(45) Date of Patent: May 15, 2018

(54) LOAD DRIVING CIRCUIT

(71) Applicant: Fuji Electric Co., Ltd., Kanagawa (JP)

(72) Inventor: Sho Nakagawa, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days. days.

(21) Appl. No.: 15/724,024

(22) Filed: Oct. 3, 2017

(30) Foreign Application Priority Data

Nov. 11, 2016 (JP) .................... 2016-220122

(51) Int. Cl.
*H03K 17/06* (2006.01)
*H02M 3/07* (2006.01)

(52) U.S. Cl.
CPC .................... *H02M 3/07* (2013.01)

(58) Field of Classification Search
CPC .. H02M 3/07; H02M 3/073; H02M 2003/076; H02M 2003/077; G11C 5/145; H03K 17/041; H03K 17/04106; H03K 17/06; H03K 17/063
See application file for complete search history.

(56) References Cited

U.S. PATENT DOCUMENTS 9,225,253 B2 * 12/2015 Lei .................. H02M 3/158
9,742,271 B2 * 8/2017 Theoduloz .............. H02M 1/08

FOREIGN PATENT DOCUMENTS

JP   H11-330376 A1   11/1999
JP   2008-294649 A1  12/2008

* cited by examiner

*Primary Examiner* — Gary L Laxton
(74) *Attorney, Agent, or Firm* — Chen Yoshimura LLP

(57) ABSTRACT

A charge pump circuit in a high-side intelligent power switch includes a switching unit between an oscillating unit and a charge-up unit. When the high-side IPS serving as a load driving circuit is in a standby state, a MOSFET switches ON and the switching unit blocks the transmission of signals output from the oscillating unit to the charge-up unit. This prevents a power supply voltage, which can potentially fluctuate, from being applied to capacitors of the charge-up unit via body diodes of inverter circuits in the switching unit while the high-side IPS is in the standby state, thereby suitably protecting the capacitors.

6 Claims, 7 Drawing Sheets

US 9,973,082 B1

LOAD DRIVING CIRCUIT

BACKGROUND OF THE INVENTION

Technical Field

The present invention relates to a load driving circuit, and more particularly to a load driving circuit that is arranged on the high voltage side of a power supply and controls switching of a load arranged on the ground side of the power supply.

Background Art

Many automobiles are equipped with load driving circuits for controlling the switching of loads such as motors. One widely used type of such a load driving circuit for use in automobiles is the high-side intelligent power switch (IPS), which is arranged on the high side of the load and in which a semiconductor switch for driving the load as well as a control circuit for the semiconductor switch are integrated together. When using this type of load driving circuit, the load is connected to ground, which is advantageous in that the load can be safely replaced without risk of electric shock, for example. Moreover, typically an n-channel metal-oxide-semiconductor field-effect transistor (MOSFET) is used for the semiconductor switch in the high-side load driving circuit. This is because n-channel MOSFETs exhibit a lower on-resistance per unit area than p-channel MOSFETs.

In high-side load driving circuits, because the n-channel MOSFET semiconductor switch is arranged on a higher-voltage side of the power supply than the load, a gate voltage higher than the supply voltage must be applied to the gate of the semiconductor switch in order to switch ON the semiconductor switch. Therefore, high-side load driving circuits include a charge pump circuit for generating a gate voltage higher than the supply voltage (see Patent Document 1, for example).

In the load driving circuit disclosed in Patent Document 1, the charge pump circuit includes three capacitors in which the ends on one side are respectively connected via diodes to a power supply VDH, three inverters that respectively drive the other ends of the capacitors, and a negative power supply VDL that serves as the power supply for the inverters. The negative power supply VDL is referenced to the voltage of the power supply VDH, and therefore when each capacitor is charged, voltages that are multiples of approximately (VDL−Vf) (where Vf is the forward voltage of the diodes) are sequentially applied across both ends of each capacitor. In other words, the voltages applied across both ends of each capacitor do not depend on the voltage of the power supply VDH. The voltage stored in the capacitor in the final stage is then applied to the gate of the semiconductor switch as the gate voltage for switching ON the semiconductor switch.

Meanwhile, to switch OFF the semiconductor switch, a switch arranged between the charge pump circuit and the semiconductor switch is switched OFF, and a switch arranged between the gate of the semiconductor switch and the ground is switched ON. At this time, the output voltage of the charge pump circuit is fixed to a voltage obtained by resistively dividing the voltage of the power supply VDH, and the voltage of the other ends of the capacitors changes between VDH and (VDH−VDL). Therefore, the voltages applied across both ends of the capacitors are, at most, equal to the voltage difference between the VDH voltage and the voltage obtained by resistively dividing the VDH voltage, and never exceed the VDH voltage.

RELATED ART DOCUMENT

Patent Document

Patent Document 1: Japanese Patent Application Laid-Open Publication No. H11-330376 (paragraphs [0010] to [0019], FIG. 1)

SUMMARY OF THE INVENTION

However, the load driving circuit disclosed in Patent Document 1 assumes that the voltage of the power supply never changes, and therefore when an automobile battery in which voltage can fluctuate significantly is used as the power supply, the voltages applied across both ends of the capacitors may exceed the rated battery voltage, even if only temporarily. This is because when the output semiconductor switch is switched OFF, the output voltage of the charge pump circuit is a voltage obtained by resistively dividing the voltage of the power supply, and therefore the output voltage of the charge pump circuit changes in accordance with the voltage of the power supply, which causes the voltages applied across both ends of the capacitors to also change in accordance with the voltage of the power supply. Therefore, in the load driving circuit disclosed in Patent Document 1, the voltages applied across both ends of the capacitors can potentially exceed the rated voltage of the power supply in applications in which the voltage of the power supply changes significantly.

The present invention was made in light of the foregoing and aims to provide a load driving circuit in which abnormally high voltages are not applied across both ends of capacitors even in applications in which the supply voltage fluctuates significantly. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a load driving circuit configured to be arranged on a high side of a load for switching the load ON and OFF, including: an n-channel transistor configured to be connected between a power supply and the load so as to switch the load ON and OFF; and a charge pump circuit that is powered by an internal power supply that is provided within the load driving circuit and that references to a power supply voltage of the power supply, the charge pump circuit generating a gate voltage that is boosted higher than the power supply voltage of the power supply for switching the n-channel transistor ON, when the n-channel transistor is to be switched ON to turn the load ON, wherein the charge pump circuit includes: an oscillating unit including an oscillator circuit, a first inverter circuit that inverts a signal output from the oscillator circuit and outputs a first oscillation signal, and a second inverter circuit that outputs a second oscillation signal that is inverted relative to the first oscillation signal; a switching unit including a first switch and a second switch that are respectively connected to outputs of the first inverter circuit and the second inverter circuit, that respectively transmit the first oscillation signal and the second oscillation signal while the load is to be switched ON, and that respectively block the first oscillation signal and the second oscillation signal while the load is to be switched OFF; and a charge-up unit including a plurality of capacitors, the charge-up unit generating the boosted gate voltage by charging the plurality of capacitors and sequentially superimposing respective voltages generated at the plurality of capacitors in accordance with the first oscillation signal and the second oscillation signal transmitted from the switching unit.

In the load driving circuit configured as described above, the switching unit blocks the first oscillation signal and the second oscillation signal when the load is switched OFF, and therefore even if the voltage of the power supply fluctuates significantly, abnormally high voltages are not applied across both ends of the capacitors, and the capacitors are not affected by the fluctuations in the supply voltage. It is to be understood that both the foregoing general description and the following detailed description are exemplary and explanatory, and are intended to provide further explanation of the invention as claimed.

DETAILED DESCRIPTION OF EMBODIMENTS

Next, an embodiment of the present invention will be described in detail with reference to figures and on the basis of an application to a high-side IPS as an example.

Figure 1:
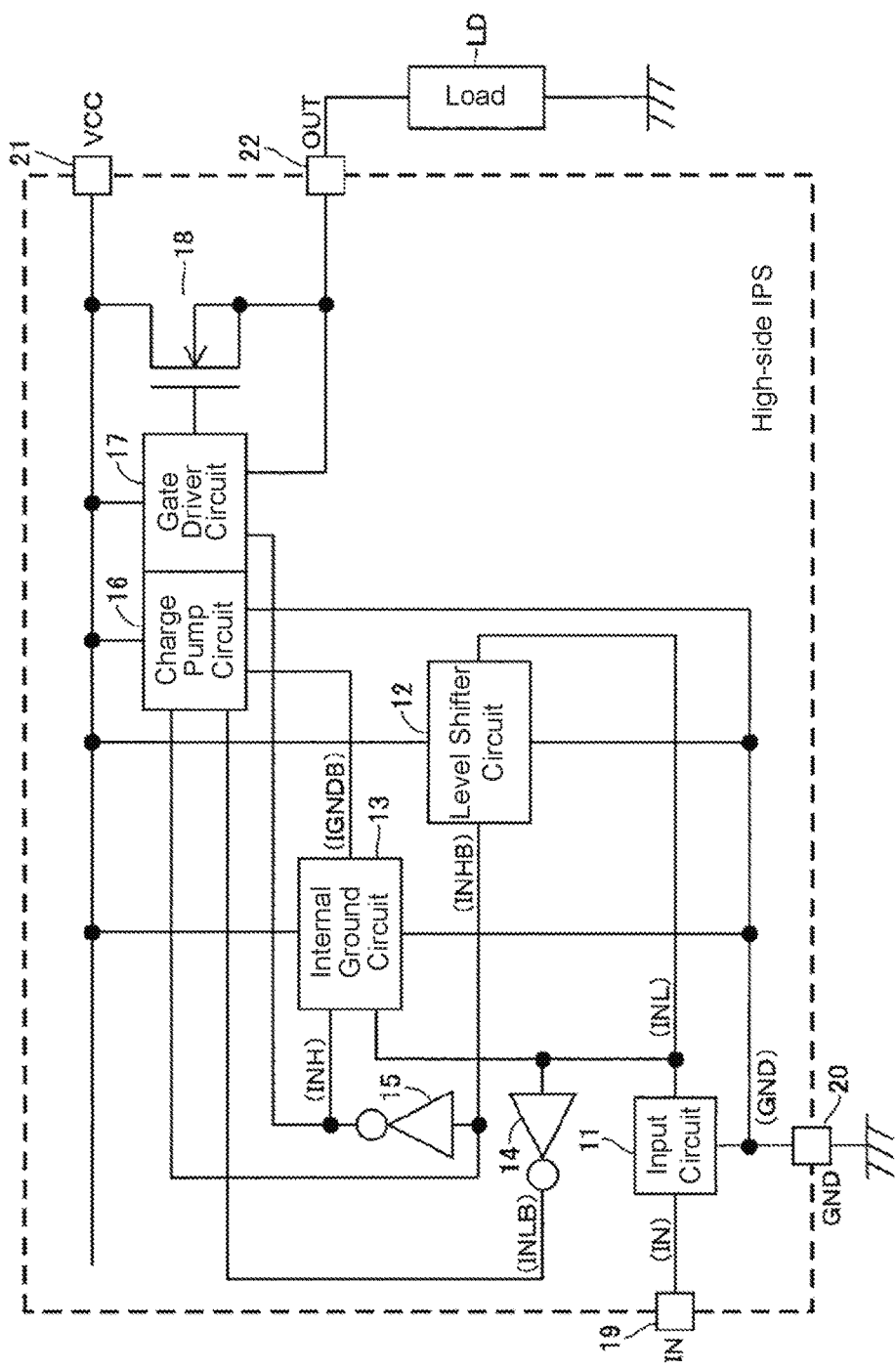
FIG. 1 is a block diagram illustrating an example of a configuration of a high-side IPS.

FIG. 1 is a block diagram illustrating an example of a configuration of the high-side IPS.

As illustrated in FIG. 1, the high-side IPS includes an input circuit 11, a level shifter circuit 12, an internal ground circuit 13, inverter circuits 14 and 15, a charge pump circuit 16, a gate driver circuit 17, and a power MOSFET 18. The power MOSFET 18 may be replaced with an insulated-gate bipolar transistor (IGBT). The following description assumes use of a power MOSFET but applies equally to use of an IGBT.

The input circuit 11 includes an input terminal that is connected to an input terminal 19 and receives an externally supplied signal IN, an output terminal that outputs a signal INL, and a ground terminal that is connected to a ground terminal 20. The signal IN is received from an upstream controller and takes a high (H) level while the high-side IPS is in an active state in which the power MOSFET 18 is switched ON and a low (L) level while in a standby state in which the power MOSFET 18 is switched OFF. The signal INL is input to the inverter circuit 14, and the inverter circuit 14 outputs a signal INLB.

The level shifter circuit 12 includes an input terminal connected to the output terminal of the input circuit 11, a power supply terminal that is connected to a power supply terminal 21 and receives a voltage VCC, a ground terminal connected to the ground terminal 20, and an output terminal that outputs a signal INHB. The level shifter circuit 12 receives the signal INL (which is referenced to the ground voltage) and outputs the signal INHB (which is referenced to the supply voltage VCC). The signal INHB is input to the inverter circuit 15, and the inverter circuit 15 outputs a signal INH.

The internal ground circuit 13 includes a first input terminal connected to the output terminal of the input circuit 11, a second input terminal connected to the output terminal of the inverter circuit 15, a power supply terminal connected to the power supply terminal 21, a ground terminal connected to the ground terminal 20, and an output terminal that outputs a signal IGNDB. The internal ground circuit 13 receives the signal INL from the input circuit 11 and the signal INH from the inverter circuit 15 and outputs the signal IGNDB, which defines the ground voltage of an internal power supply that is referenced to the voltage VCC. The signal IGNDB is switched, in accordance with the level of the signal IN input to the input terminal 19, between an H level that is equal to the voltage VCC and an L level that is less than the voltage VCC by a prescribed voltage.

The charge pump circuit 16 includes a first input terminal connected to the output terminal of the inverter circuit 14, a second input terminal connected to the output terminal of the level shifter circuit 12, a first ground terminal connected to the output terminal of the internal ground circuit 13, a second ground terminal connected to the ground terminal 20, and a power supply terminal connected to the power supply terminal 21. The charge pump circuit 16 receives the signal IGNDB from the internal ground circuit 13 and, when the signal IGNDB is at the L level, generates a gate signal that has been boosted to a voltage higher than the voltage VCC, and, when the signal IGNDB is at the H level, stops the boosting operation.

While the high-side IPS is in the active state, the gate driver circuit 17 receives the gate signal generated by the charge pump circuit 16 and applies that signal to the gate of the power MOSFET 18. Moreover, while the high-side IPS is in the standby state, the gate driver circuit 17 receives the signal INH from the inverter circuit 15 and creates a short-circuit between the gate and source of the power MOSFET 18.

In the power MOSFET 18, the drain is connected to the power supply terminal 21, and the source is connected to an output terminal 22. The output terminal 22 is connected to one terminal of a load LD, and the other terminal of the load LD is connected to ground. When the high-side IPS is in the active state, the power MOSFET 18 switches ON and supplies a signal OUT of substantially the same voltage as the voltage VCC to the load LD, and when the high-side IPS is in the standby state, the power MOSFET 18 switches OFF.

Next, specific examples of configurations of the circuits included in the high-side IPS will be described.

Figure 2:
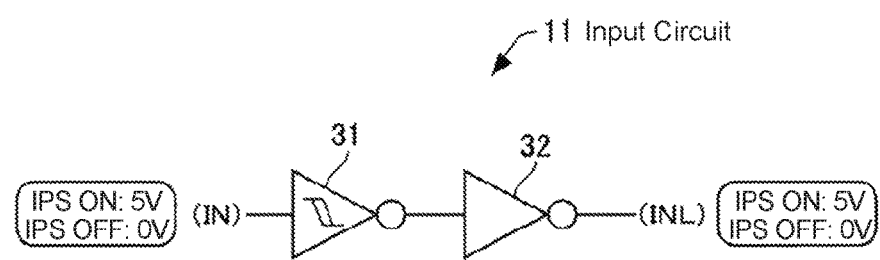
FIG. 2 is a circuit diagram illustrating an example of a configuration of an input circuit.

FIG. 2 is a circuit diagram illustrating an example of a configuration of the input circuit.

The input circuit 11 includes a Schmitt trigger inverter circuit 31 and an inverter circuit 32. In the Schmitt trigger inverter circuit 31, the input terminal is connected to the input terminal 19 of the high-side IPS, and the output terminal is connected to the input terminal of the inverter circuit 32. As a result, the input circuit 11 receives the signal IN from the input terminal 19 and outputs the signal INL, in which the timing of the rise and fall are delayed relative to those of the signal IN. The power source for the Schmitt trigger inverter circuit 31 and the inverter circuit 32 are voltages of 0V and 5V referenced to the ground voltage, and the signals IN and INL are both logic signals for which the H level is 5V and the L level is 0V.

Figure 3:
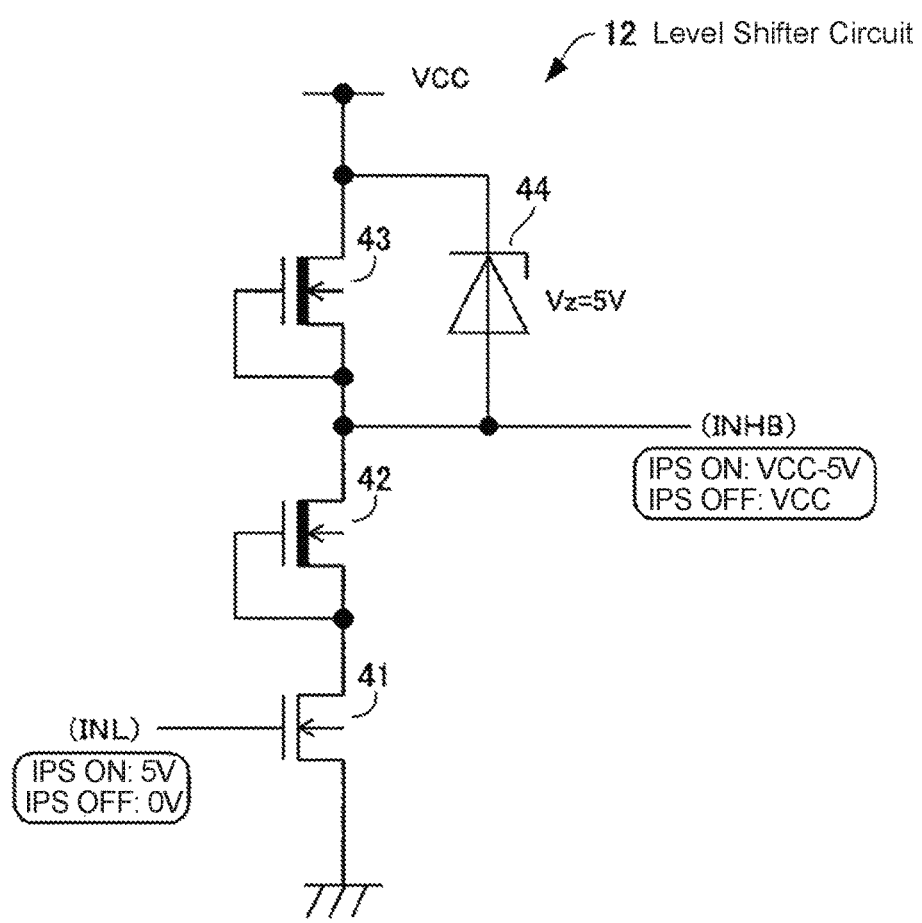
FIG. 3 is a circuit diagram illustrating an example of a configuration of a level shifter circuit.

FIG. 3 is a circuit diagram illustrating an example of a configuration of the level shifter circuit.

The level shifter circuit 12 includes n-channel MOSFETs 41, 42, and 43 and a Zener diode 44. In the MOSFET 41, the gate is connected to the output terminal of the input circuit 11 and the source is connected to the ground terminal 20 of the high-side IPS. The drain of the MOSFET 41 is connected to the source and gate of the MOSFET 42. The drain of the MOSFET 42 is connected to the source and gate of the MOSFET 43, to the anode of the Zener diode 44, and to the output terminal of the level shifter circuit 12. The drain of the MOSFET 43 is connected to the power supply terminal 21 of the high-side IPS and to the cathode of the Zener diode 44.

The MOSFETs 42 and 43 are depletion-mode MOSFETs, and by having the gate and source connected together, function as constant current circuits that pass a drain saturation current corresponding to a gate-source voltage of 0V. In the present embodiment, a diode with a breakdown voltage of 5V is used for the Zener diode 44.

In the level shifter circuit 12, when the signal INL is at the L level (0V), the MOSFET 41 switches OFF, and at such time, the signal INHB of voltage VCC is output to the output terminal. When the signal INL is at the H level (5V), the MOSFET 41 switches ON and outputs the signal INHB of voltage (VCC−5V) to the output terminal.

Figure 4:
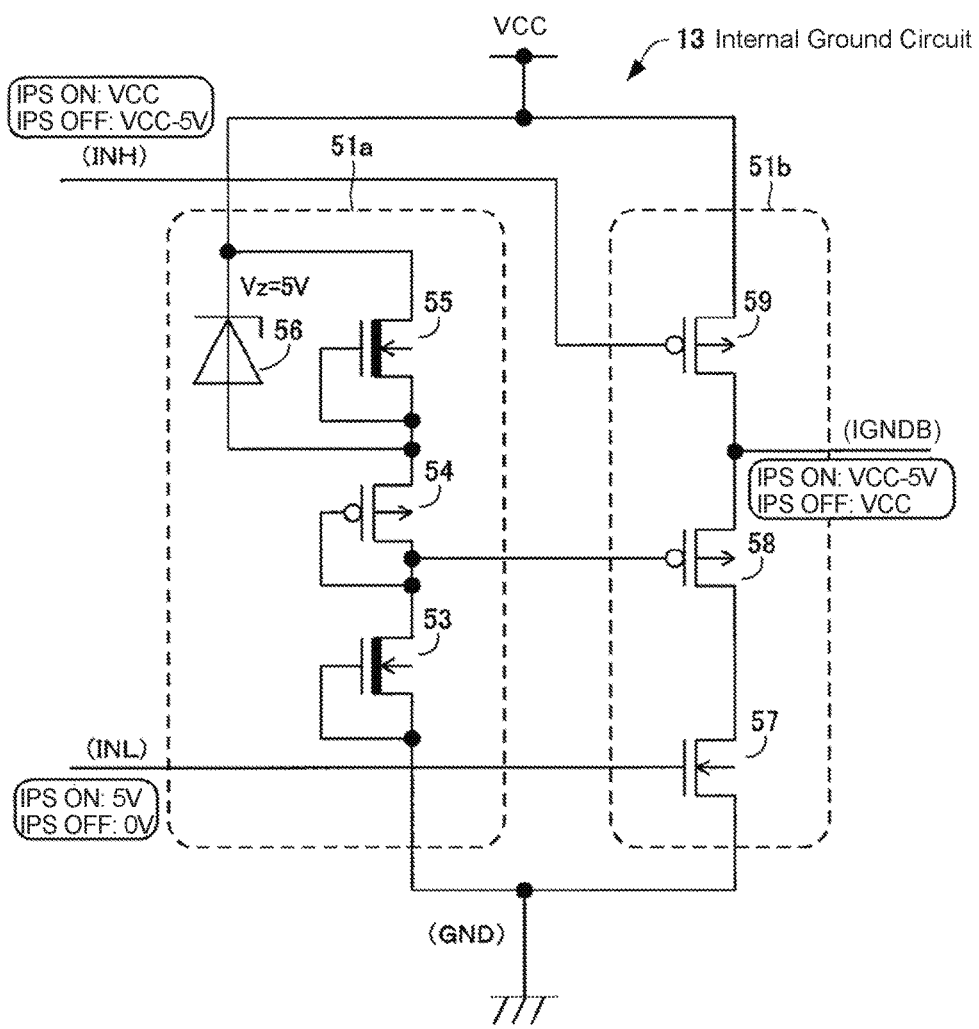
FIG. 4 is a circuit diagram illustrating an example of a configuration of an internal ground circuit.

FIG. 4 is a circuit diagram illustrating an example of a configuration of the internal ground circuit.

The internal ground circuit 13 includes a front-stage unit 51a and an output unit 51b. The front-stage unit 51a includes n-channel MOSFETs 53 and 55, a p-channel MOSFET 54, and a Zener diode 56, and the output unit 51b includes an n-channel MOSFET 57 and p-channel MOSFETs 58 and 59. Thus, the internal ground circuit 13 is also the internal power supply, which outputs the voltage of the Zener diode 56 referenced to the supply voltage VCC.

In the front-stage unit 51a, the source and gate of the MOSFET 53 are connected to the ground terminal 20 of the high-side IPS. The drain of the MOSFET 53 is connected to the drain and gate of the MOSFET 54. The source of the MOSFET 54 is connected to the source and gate of the MOSFET 55 and to the anode of the Zener diode 56. The drain of the MOSFET 55 is connected to the cathode of the Zener diode 56 and to the power supply terminal 21 of the high-side IPS. In the present embodiment, a diode with a breakdown voltage of 5V is used for the Zener diode 56.

In the MOSFET 57 of the output unit 51b, the gate is connected to the output terminal of the input circuit 11 and the source is connected to the ground terminal 20 of the high-side IPS. The drain of the MOSFET 57 is connected to the drain of the MOSFET 58, and the gate of the MOSFET 58 is connected to the node between the drain of the MOSFET 53 and the drain of the MOSFET 54 in the front-stage unit 51a. The source of the MOSFET 58 is connected to the drain of the MOSFET 59, and the gate of the MOSFET 59 is connected to the output terminal of the inverter circuit 15. The source of the MOSFET 59 is connected to the power supply terminal 21 of the high-side IPS. Moreover, the node between the source of the MOSFET 58 and the drain of the MOSFET 59 forms the output terminal of the internal ground circuit 13.

Here, the internal ground circuit 13 receives the signal INL from the input circuit 11 and receives the signal INH from the inverter circuit 15. When the high-side IPS is in the active state, the signal INL is at the H level (5V) and the signal INH is at an H level (VCC), and when the high-side IPS is in the standby state, the signal INL is at the L level (0V) and the signal INH is at an L level (VCC−5V).

The node between the source of the MOSFET 54 and the source of the MOSFET 55 takes a voltage (VCC−5V) equal to the voltage VCC minus the breakdown voltage of the Zener diode 56 (5V). Here, because the MOSFET 54 has a diode-connected configuration, the voltage drop due to the MOSFET 54 takes a value close to the threshold voltage VTHP of the p-channel MOSFET. Moreover, the power source for the inverter circuit 15 is drawn from the node between the power supply terminal 21, the source of the MOSFET 54, and the source of the MOSFET 55.

When the high-side IPS is in the active state, the MOSFET 57 of the output unit 51b switches ON and the MOSFET 59 switches OFF, and therefore the MOSFET 58 functions as a source follower circuit. Due to the MOSFET 58 functioning as a source follower circuit, the gate-source voltage of the MOSFET 58 takes a value close to VTHP and cancels out the voltage drop due to the MOSFET 54, and therefore the node between the source of the MOSFET 58 and the drain of the MOSFET 59 outputs the signal IGNDB at the level of the voltage (VCC−5V) of the node between the source of the MOSFET 54 and the source of the MOSFET 55.

When the high-side IPS is in the standby state, the MOSFET 57 of the output unit 51b is OFF and the MOSFET 59 is ON, and therefore the node between the source of the MOSFET 58 and the drain of the MOSFET 59 outputs the signal IGNDB at the level of the voltage VCC.

Figure 5:
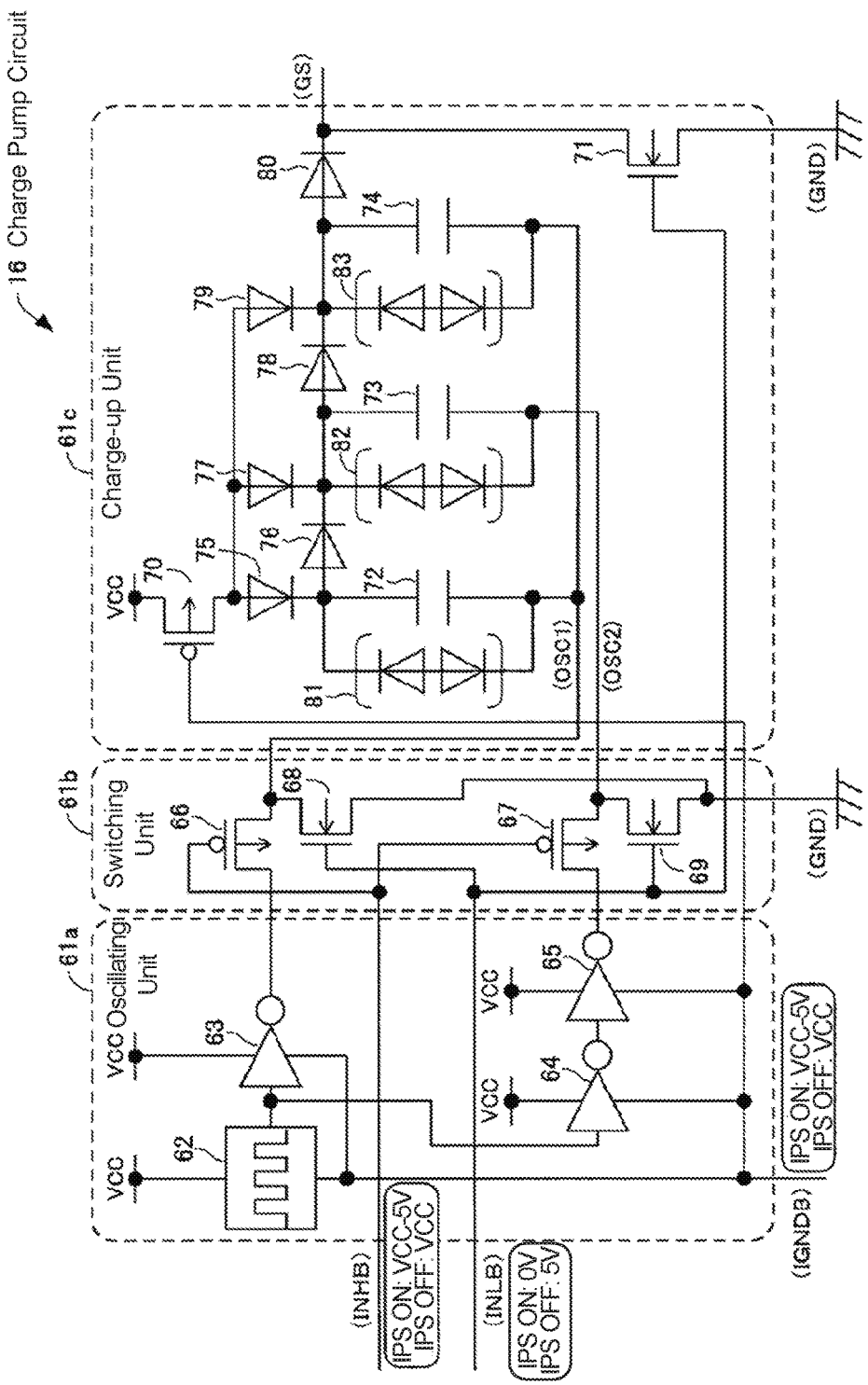
FIG. 5 is a circuit diagram illustrating an example of a configuration of a charge pump circuit.

FIG. 5 is a circuit diagram illustrating an example of a configuration of the charge pump circuit.

The charge pump circuit 16 includes an oscillating unit 61a, a switching unit 61b, and a charge-up unit 61c. The oscillating unit 61a includes an oscillator circuit 62, an inverter circuit (first inverter circuit) 63, an inverter circuit 64, and an inverter circuit (second inverter circuit) 65. The switching unit 61b includes p-channel MOSFETs (first and second switches) 66 and 67 and n-channel MOSFETs (third and fourth switches) 68 and 69. The charge-up unit 61c includes a p-channel MOSFET 70; an n-channel MOSFET 71; capacitors 72, 73, and 74; diodes 75 to 80; and protective diodes 81, 82, and 83.

In the oscillating unit 61a, the oscillator circuit 62 is a self-oscillating circuit that includes a power supply terminal connected to the power supply terminal 21 of the high-side IPS, a ground terminal connected to the output terminal of the internal ground circuit 13, and an output terminal that outputs a square-wave oscillation signal. The output terminal of the oscillator circuit 62 is connected to the input terminals of the inverter circuits 63 and 64, and the output terminal of the inverter circuit 64 is connected to the input terminal of the inverter circuit 65. Similar to the oscillator circuit 62, the inverter circuits 63, 64, and 65 are connected to the power supply terminal 21 of the high-side IPS and to the output terminal of the internal ground circuit 13. Therefore, the oscillating unit 61a oscillates while the signal IGNDB from the internal ground circuit 13 is at the voltage (VCC−5V) and stops oscillating when the signal IGNDB is at the voltage VCC.

In the switching unit 61b, the sources of the p-channel MOSFETs 66 and 67 are respectively connected to the output terminals of the inverter circuits 63 and 65 of the oscillating unit 61a. The gates of the MOSFETs 66 and 67 are connected to the second input terminal of the charge pump circuit 16, which receives the signal INHB from the level shifter circuit 12. The drains of the n-channel MOSFETs 68 and 69 are respectively connected to the drains of the p-channel MOSFETs 66 and 67. The gates of the MOSFETs 68 and 69 are connected to the first input terminal of the charge pump circuit 16, which receives the signal INLB output by the inverter circuit 14. The sources of the MOSFETs 68 and 69 are connected to the ground terminal 20 of the high-side IPS. Therefore, the switching unit 61b blocks the output of the oscillating unit 61a while receiving the signal INHB at the voltage VCC and transmits the output of the oscillating unit 61a to the charge-up unit 61c while receiving the signal INHB at the voltage (VCC−5V). Moreover, the switching unit 61b connects the drains of the MOSFETs 66 and 67 to the ground terminal 20 of the high-side IPS while receiving the signal INLB at the H level (5V) and does nothing while receiving the signal INLB at the L level (0V).

In the charge-up unit 61c, the source of the p-channel MOSFET 70 is connected to the power supply terminal 21 of the high-side IPS and the gate is connected to the first ground terminal of the charge pump circuit 16, which receives the signal IGNDB. The drain of the MOSFET 70 is connected to the anodes of the diodes 75, 77, and 79, and the cathodes of the diodes 75, 77, and 79 are respectively connected to the terminals of the capacitors 72, 73, and 74 on one side. The other terminals of the capacitors 72 and 74 are connected to the drain of the MOSFET 66 of the switching unit 61b, and the other terminal of the capacitor 73 is connected to the drain of the MOSFET 67 of the switching unit 61b. The node between the cathode of the diode 75 and the one terminal of the capacitor 72 is connected to the anode of the diode 76, and the node between the cathode of the diode 77 and the one terminal of the capacitor 73 is connected to the cathode of the diode 76. The node between the cathode of the diode 77 and the one terminal of the capacitor 73 is connected to the anode of the diode 78, and the node between the cathode of the diode 79 and the one terminal of the capacitor 74 is connected to the cathode of the diode 78. The node between the cathode of the diode 79 and the one terminal of the capacitor 74 is connected to the anode of the diode 80, and the cathode of the diode 80 forms the output terminal of the charge pump circuit 16. The cathode of the diode 80 is connected to the drain of the n-channel MOSFET 71, and the source of the MOSFET 71 is connected to the ground terminal 20 of the high-side IPS via the second ground terminal of the charge pump circuit 16.

Moreover, the protective diodes 81, 82, and 83 are respectively connected in parallel to the capacitors 72, 73, and 74. The protective diodes 81, 82, and 83 are included as a precautionary measure to prevent excessive voltages from being applied to the capacitors 72, 73, and 74.

The charge-up unit 61c only boosts the voltage while the signal IGNDB is at the L level of (VCC−5V) (that is, while the high-side IPS is in the active state). In other words, while a signal (first oscillation signal) OSC1 output by the inverter circuit 63 of the oscillating unit 61a is at the L level (VCC−5V), the capacitor 72 is charged from the power supply terminal 21 via the MOSFET 70 and the diode 75, and is charged to a terminal voltage of approximately (5V−Vf). Here, Vf is the forward voltage of the diode.

Then, when the signal OSC1 inverts to the H level (VCC), the voltage VCC is applied to the other terminal of the capacitor 72, and therefore the terminal voltage of the capacitor 72 has a voltage of (5V) added to the previously stored voltage of (5V−Vf) and becomes equal to approximately (2×5V−Vf). At this time, a signal (second oscillation signal) OSC2 output from the inverter circuit 65 to the other terminal of the capacitor 73 in the next stage is at the L level (VCC−5V), and therefore the capacitor 73 is charged to a terminal voltage of approximately 2×(5V−Vf).

Next, when the signal OSC2 inverts to the H level (VCC), the voltage VCC is applied to the other terminal of the capacitor 73, and therefore the terminal voltage of the capacitor 73 becomes equal to approximately (3×5V−2Vf). At this time, the signal OSC1 output from the inverter circuit 63 to the other terminal of the capacitor 74 in the final stage is at the L level (VCC−5V), and therefore the terminal voltage of the capacitor 74 becomes equal to approximately 3×(5V−Vf). The voltage boosted to approximately 3×(5V−Vf) is then output from the charge pump circuit 16 via the diode 80 as a gate signal GS.

Meanwhile, when the high-side IPS is in the standby state, the signal IGNDB from the internal ground circuit 13 is at the H level (VCC). At this time, the internal ground voltage of the oscillating unit 61a is equal to the supply voltage VCC, and therefore the oscillating unit 61a stops oscillating. Moreover, the MOSFETs 66 and 67 of the switching unit 61b switch OFF, thereby disconnecting the charge-up unit 61c from the oscillating unit 61a. In addition, in the charge-up unit 61c that is storing the boosted voltage, the lines connected to the other terminals of the capacitors 72, 73, and 74 are grounded due to the MOSFETs 68 and 69 switching ON, and the cathode of the diode 80 is grounded due to the MOSFET 71 switching ON. Therefore, the respective terminal voltages of the capacitors 72, 73, and 74 instantaneously decrease to values substantially equal to 0V and do not continue to be maintained at high voltages.

More specifically, while the high-side IPS is in the standby state, in the charge pump circuit 16, the MOSFETs 66 and 67 of the switching unit 61b cut off the outputs from the inverter circuits 63 and 65. Therefore, in the capacitors 72, 73, and 74 in which the one terminals are now at the ground voltage, the H level (VCC) voltage of the signal IGNDB is never applied to the other terminals. In other words, because the inverter circuits 63 and 65 are typically complementary MOS (CMOS) devices, if the MOSFETs 66 and 67 were not present, when the signal IGNDB from the internal ground circuit 13 was at the H level (VCC), the voltage VCC would be applied to the other terminals of the capacitors 72, 73, and 74 via the body diodes of the n-channel MOSFETs included in the inverter circuits 63 and 65. However, switching OFF the MOSFETs 66 and 67 makes it possible to avoid this. Therefore, even when the voltage VCC unavoidably becomes abnormally high, for example, that voltage VCC is not applied to the capacitors 72, 73, and 74, which makes it possible to reliably protect the capacitors 72, 73, and 74 from high voltages. Moreover, in the charge pump circuit 16, the MOSFETs 68 and 69 forcibly ground the other terminals of the capacitors 72, 73, and 74 in order to avoid the other terminals of the capacitors 72, 73, and 74 from being in a floating state by being cut off by the MOSFETs 66 and 67.

Figure 6:
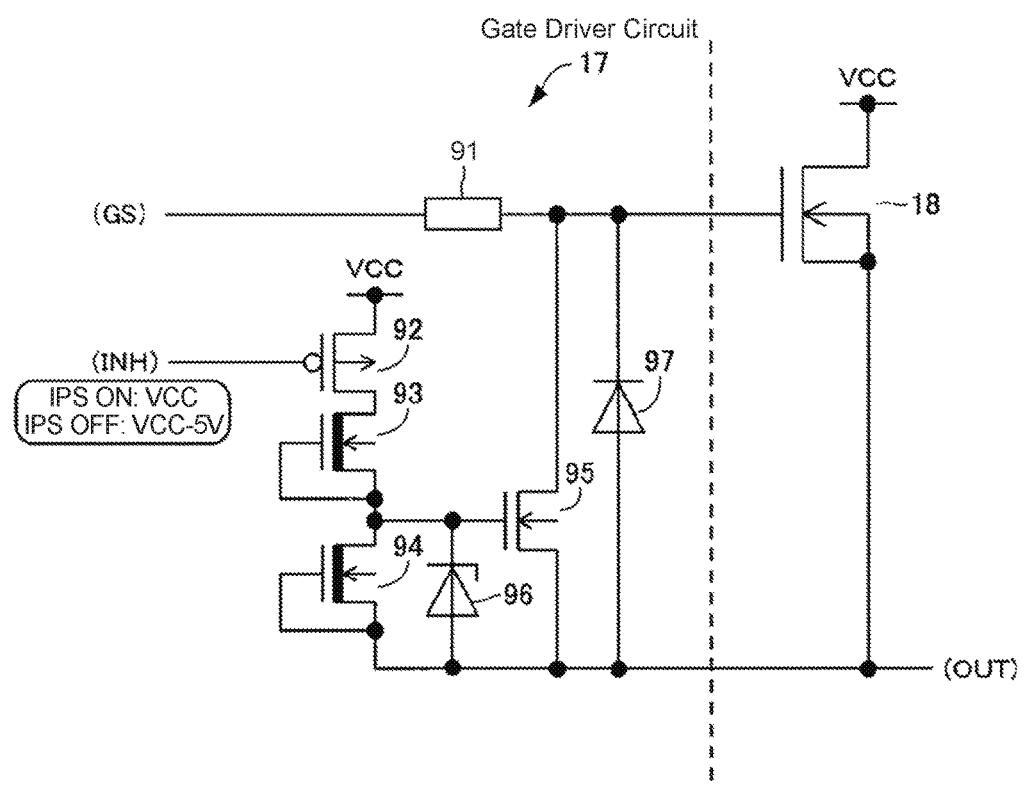
FIG. 6 is a circuit diagram illustrating an example of a configuration of a gate driver circuit.

FIG. 6 is a circuit diagram illustrating an example of a configuration of the gate driver circuit.

The gate driver circuit 17 includes a resistor 91, a p-channel MOSFET 92, depletion-mode n-channel MOSFETs 93 and 94, an n-channel MOSFET 95, a Zener diode 96, and a diode 97.

In the gate driver circuit 17, one terminal of the resistor 91 is connected to an input terminal that receives the gate signal GS output by the charge pump circuit 16, and the other terminal of the resistor 91 is connected to an output terminal that is connected to the gate of the power MOSFET 18. In the p-channel MOSFET 92, the source is connected to the power supply terminal 21 of the high-side IPS and the gate is connected to an input terminal that receives the signal INH from the inverter circuit 15. The drain of the MOSFET 92 is connected to the drain of the n-channel MOSFET 93. The gate of the MOSFET 93 is connected to the source of the same and to the drain of the MOSFET 94. The gate of the MOSFET 94 is connected to the source of the same, and the source of the MOSFET 94 is connected to the output terminal 22 of the high-side IPS. The node between the source of the MOSFET 93 and the drain of the MOSFET 94 is connected to the gate of the n-channel MOSFET 95 and to the cathode of the Zener diode 96, and the anode of the Zener diode 96 is connected to the output terminal 22 of the high-side IPS. In the MOSFET 95, the drain is connected to the other terminal of the resistor 91 and the source is connected to the output terminal 22 of the high-side IPS. In the diode 97, the cathode is connected to the other terminal of the resistor 91 and the anode is connected to the output terminal 22 of the high-side IPS.

In the gate driver circuit 17, while the high-side IPS is in the active state, the gate signal GS in which the voltage VCC is boosted by the charge pump circuit 16 is input to the one terminal of the resistor 91, passes through the resistor 91, and is then supplied from the other terminal thereof to the gate of the power MOSFET 18. The power MOSFET 18 therefore switches ON and supplies the voltage VCC to the load LD. At this time, the signal INH is input at the H level (VCC) voltage, which keeps the MOSFET 92 OFF and therefore also keeps the MOSFET 95 that is arranged between the gate and source of the power MOSFET 18 OFF.

When the high-side IPS is in the standby state, the gate signal GS input to the one terminal of the resistor 91 is at the ground voltage, and the signal INH input to the MOSFET 92 is at the L level (VCC−5V). The power MOSFET 18 therefore switches OFF. Moreover, the MOSFET 92 switches ON and the MOSFET 95 switches ON, thereby creating a short-circuit between the gate and source of the power MOSFET 18 and more reliably keeping the power MOSFET 18 in the OFF state.

Next, the overall operation of the high-side IPS configured as described above will be described in more detail with reference to the timing chart in FIG. 7.

Figure 7:
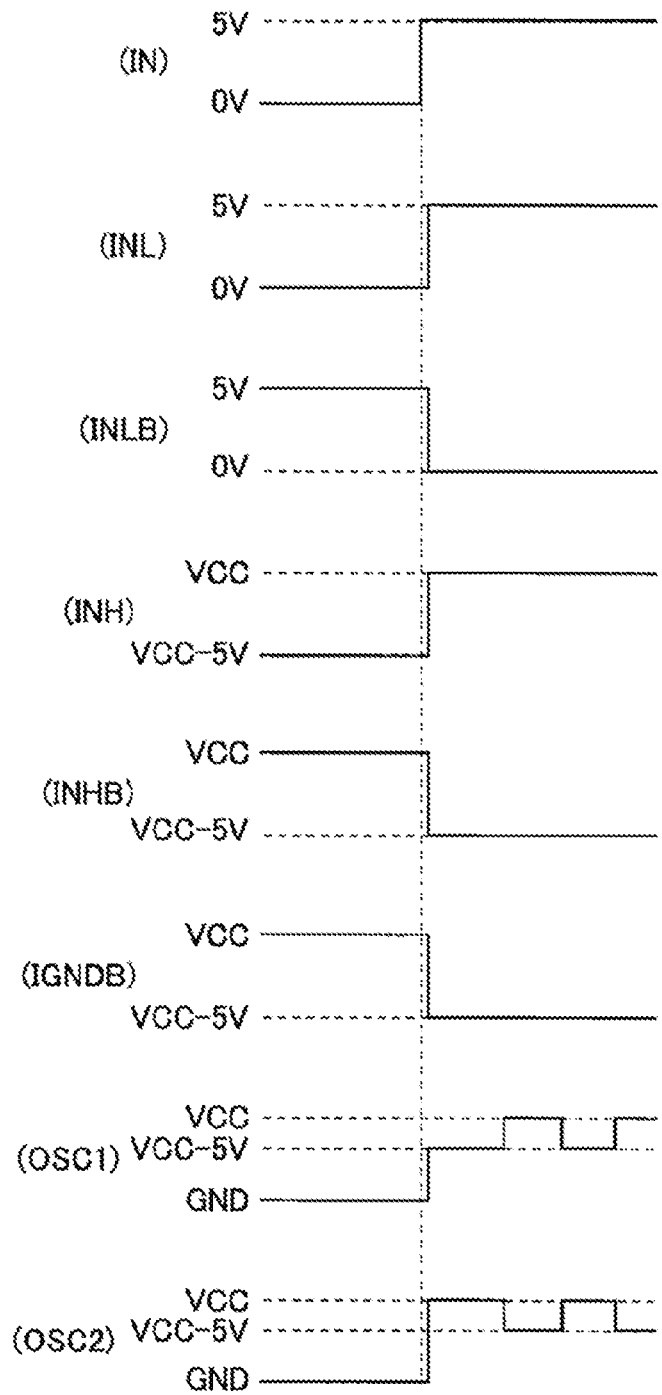
FIG. 7 is a primary component timing chart illustrating the operation of the high-side IPS.

FIG. 7 is a primary component timing chart illustrating the operation of the high-side IPS. FIG. 7 illustrates, from top to bottom, the signal IN, the signal INL, the signal INLB, the signal INH, the signal INHB, the signal IGNDB, the signal OSC1, and the signal OSC2.

First, while the signal IN is input to the input terminal 19 at the L level (0V), the power MOSFET 18 remains switched OFF and the high-side IPS remains in the standby state. In other words, when the signal IN is at the L level (0V), the signal INL output by the input circuit 11 is also at the L level (0V). This L level (0V) signal INL is inverted by the inverter circuit 14 to the H level (5V) and becomes the signal INLB and is also level-shifted by the level shifter circuit 12 to the H level (VCC) and becomes the signal INHB. This H level (VCC) signal INHB is then inverted by the inverter circuit 15 to the L level (VCC−5V) and becomes the signal INH.

In the internal ground circuit 13, the MOSFET 57 switches OFF due to the signal INL being input at the L level (0V), and the MOSFET 59 switches ON due to the signal INH being input at the L level (VCC−5V). Therefore, the internal ground circuit 13 outputs the signal IGNDB at the H level (VCC).

In the charge pump circuit 16, due to the H level (VCC) signal IGNDB being input as the internal ground voltage at the same level as the voltage VCC of the power supply terminal 21, the oscillating unit 61a stops oscillating. At this time, in the switching unit 61b, the MOSFETs 66 and 67 switch OFF due to the signal INHB being input at the H level (VCC), and the MOSFETs 68 and 69 switch ON due to the signal INLB being input at the H level (5V). Due to the MOSFETs 68 and 69 of the switching unit 61b switching ON, the signals OSC1 and OSC2 input to the charge-up unit 61c are set to the ground voltage. Moreover, the MOSFET 70 of the charge-up unit 61c switches OFF due to the signal IGNDB being input at the H level (VCC). In addition, in the charge-up unit 61c, the MOSFET 71 switches ON due to the signal INLB being input at the H level (5V), and the gate signal GS is set to the ground voltage. In other words, both terminals of each of the capacitors 72, 73, and 74 are set to the ground voltage and do not depend on the supply voltage VCC of the high-side IPS. Therefore, while the high-side IPS is in the standby state in which the power MOSFET 18 is switched OFF, excessive voltages are never applied across both terminals of the capacitors 72, 73, and 74 even if the voltage VCC fluctuates significantly.

In the gate driver circuit 17, the power MOSFET 18 switches OFF due to gate signal GS being input at the ground voltage, and the MOSFETs 92 and 95 switch ON due to the signal INH being input at the L level (VCC−5V) from the inverter circuit 15. Due to the MOSFET 95 switching ON, the gate-source voltage of the power MOSFET 18 immediately becomes substantially equal to 0V, thereby keeping the power MOSFET 18 in the OFF state more reliably.

Next, when the signal IN is input to the input terminal 19 at the H level (5V), the power MOSFET 18 switches ON and the high-side IPS enters the active state. In other words, when the signal IN is at the H level (5V), the signal INL output by the input circuit 11 is also at the H level (5V). This H level (5V) signal INL is inverted by the inverter circuit 14 to the L level (0V) and becomes the signal INLB and is also level-shifted by the level shifter circuit 12 to the L level (VCC−5V) and becomes the signal INHB. This L level (VCC−5V) signal INHB is then inverted by the inverter circuit 15 to the H level (VCC) and becomes the signal INH.

In the internal ground circuit 13, the MOSFET 57 switches ON due to the signal INL being input at the H level (5V), and the MOSFET 59 switches OFF due to the signal INH being input at the H level (VCC). Therefore, the internal ground circuit 13 outputs the signal IGNDB at the L level (VCC−5V).

In the charge pump circuit 16, due to the signal IGNDB being input at the L level (VCC−5V) as the internal ground voltage, the oscillating unit 61a starts oscillating. At this time, in the switching unit 61b, the MOSFETs 66 and 67 switch ON due to the signal INHB being input at the L level (VCC−5V), and the MOSFETs 68 and 69 switch OFF due to the signal INLB being input at the L level (0V). Therefore, when the signal IN changes from the L level (0V) to the H level (5V), the signals OSC1 and OSC2 input to the charge-up unit 61c from the oscillating unit 61a start from the ground voltage level from the standby state, and when the signal OSC1 changes to the L level (VCC−5V), the signal OSC2 changes to the H level (VCC). Then, the signals OSC1 and OSC2 continue inverting relative to one another. This causes the charge-up unit 61c to charge up and output the boosted gate signal GS.

In the gate driver circuit 17, due to the boosted gate signal GS being input, the power MOSFET 18 switches ON and applies the voltage VCC to the load LD. At this time, due to the signal INH being input at the H level (VCC) from the inverter circuit 15, the MOSFET 92 switches OFF and the MOSFETs 93, 94, and 95 also switch OFF. Due to the MOSFET 95 switching OFF, the power MOSFET 18 is no longer forced OFF by the MOSFET 95.

In the present embodiment, the oscillating unit 61a of the charge pump circuit 16 is configured to stop oscillating upon receiving the signal IGNDB at the voltage VCC. This is to make the oscillating unit 61a stop oscillating in order to reduce power consumption while receiving the signal IGNDB at the voltage VCC. Therefore, if reducing power consumption is not a consideration, the oscillation of the oscillating unit 61a does not necessarily need to be stopped while the high-side IPS is in the standby state and may instead be allowed to continue. Moreover, in the switching unit 61b, although the MOSFETs 68 and 69 are switched ON while the MOSFETs 66 and 67 are OFF, these MOSFETs 68 and 69 do not necessarily need to be included. Furthermore, in the charge-up unit 61c, although the protective diodes 81, 82, and 83 are connected in parallel to the capacitors 72, 73, and 74, these protective diodes 81, 82, and 83 do not necessarily need to be included and may be omitted.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A load driving circuit configured to be arranged on a high side of a load for switching the load ON and OFF, comprising:
    an n-channel transistor configured to be connected between a power supply and the load so as to switch the load ON and OFF; and
    a charge pump circuit that is powered by an internal power supply that is provided within the load driving circuit and that references to a power supply voltage of the power supply, the charge pump circuit generating a gate voltage that is boosted higher than the power supply voltage of the power supply for switching the n-channel transistor ON, when the n-channel transistor is to be switched ON to turn the load ON,
    wherein the charge pump circuit includes:
        an oscillating unit including an oscillator circuit, a first inverter circuit that inverts a signal output from the oscillator circuit and outputs a first oscillation signal, and a second inverter circuit that outputs a second oscillation signal that is inverted relative to the first oscillation signal;
        a switching unit including a first switch and a second switch that are respectively connected to outputs of the first inverter circuit and the second inverter circuit, that respectively transmit the first oscillation signal and the second oscillation signal while the load is to be switched ON, and that respectively block the first oscillation signal and the second oscillation signal while the load is to be switched OFF; and
        a charge-up unit including a plurality of capacitors, the charge-up unit generating the boosted gate voltage by charging the plurality of capacitors and sequentially superimposing respective voltages generated at the plurality of capacitors in accordance with the first oscillation signal and the second oscillation signal transmitted from the switching unit.

2. The load driving circuit according to claim 1, wherein the first switch and the second switch of the switching unit are p-channel MOSFETs that switch ON at a ground voltage of the internal power supply and switch OFF at the power supply voltage of the power supply.

3. The load driving circuit according to claim 1, wherein the switching unit includes a third switch and a fourth switch that are respectively arranged at nodes between outputs of the first switch and the second switch and the charge-up unit and that connect the outputs of the first switch and the second switch to a ground of the load driving circuit only when the load is to be switched OFF.

4. The load driving circuit according to claim 3, wherein the third switch and the fourth switch of the switching unit are n-channel MOSFETs that switch OFF upon receiving an input signal that switches the load ON and that switch ON upon receiving an input signal that switches the load OFF.

5. The load driving circuit according to claim 1, wherein the oscillator circuit receives an internal ground voltage signal from the internal power supply at a ground terminal of the oscillator circuit, the internal ground voltage signal from the internal power supply being a ground voltage set by the internal power supply while the load is to be switched ON, and being changed to the power supply voltage of the power supply while the load is to be switched OFF, the oscillator circuit thereby not outputting the signal while the load is to be switched OFF.

6. The load driving circuit according to claim 1, wherein the n-channel transistor is an n-channel MOSFET or an n-channel IGBT.

* * * * *